United States Patent
Itoh et al.

(10) Patent No.: US 6,773,809 B1
(45) Date of Patent: Aug. 10, 2004

(54) COPPER FOIL WITH INSULATING ADHESIVE

(75) Inventors: Takashi Itoh, Otsu (JP); Shoji Hara, Otsu (JP); Hirosaku Nagano, Otsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/707,882

(22) Filed: Nov. 8, 2000

(30) Foreign Application Priority Data

Nov. 8, 1999 (JP) .......................................... 11-316581

(51) Int. Cl.$^7$ ................................................. B32B 7/12
(52) U.S. Cl. ........................... 428/355 R; 428/355 EN; 428/355 BL; 428/448; 428/450
(58) Field of Search ..................... 428/355 EN, 355 BL, 428/448, 450, 344, 349, 355 R, 447, 451, 623, 624, 625; 525/7.2, 101, 102, 106; 528/25

(56) References Cited

U.S. PATENT DOCUMENTS

| | | | | |
|---|---|---|---|---|
| 5,008,360 A | * | 4/1991 | Bard et al. | 528/25 |
| 5,068,303 A | * | 11/1991 | Bard et al. | 528/25 |
| 5,242,979 A | * | 9/1993 | Barnum et al. | 525/106 |
| 5,451,637 A | * | 9/1995 | Leibfried | 525/105 |
| 6,320,010 B1 | * | 11/2001 | Sakaguchi et al. | 528/25 |

OTHER PUBLICATIONS

Abstract, JP 02117959, Suzuki et al., May 5, 1990.*

* cited by examiner

*Primary Examiner*—David J. Buttner
*Assistant Examiner*—Christopher Keehan
(74) *Attorney, Agent, or Firm*—Fitch, Even, Tabin & Flannery

(57) ABSTRACT

There is provided a copper foil with an insulating adhesive which is excellent in that an insulating adhesive layer has low dielectric constant, low dielectric loss tangent and high adhering force at a normal temperature and a high temperature, and steps for manufacturing a multilayer printed circuit board can be shortened due to the presence of a copper foil on which a circuit can be formed by etching or the like.

An insulating adhesive composition containing as an essential component an organic compound having at least two alkenyl groups having the reactivity with a SiH group in one molecule, and a silicon compound containing at least two SiH groups in one molecule and a copper foil are incorporated.

5 Claims, No Drawings

COPPER FOIL WITH INSULATING ADHESIVE

BACKGROUND OF THE INVENTION

1. Field of the Invention

The present invention relates to a copper foil with an insulating adhesive, more particularly, a copper foil with an insulating adhesive for a multilayer printed circuit board equipped with an insulating adhesive layer having low dielectric constant, low dielectric loss tangent and high adhering force at a normal temperature and a high temperature as well as a copper foil on which a circuit can be formed by etching processing or the like.

2. Description of Related Art

In the recent progress of downsized, multifunctional, and higher advanced electronic equipments, a printed circuit board is required to respond to the high-density packaging. In response thereto, some progress has been made, such as the adoption of a multilayered printed board, a thinner insulating layer, the shift from a traditional through-hole to an inner via-hole, a reduced via diameter, and a narrower pitch of a circuit and the like. As an embodiment of them, there is the technology of manufacturing a build-up multilayer printed circuit board.

The fabricators manufacture the build-up wiring board according to a variety of ways. Many wiring board fabricators have adopted a method of manufacturing build-up wiring board using a copper foil with an insulating adhesive, because the materials are easy to handle and because the manufacturing steps can be shortened due to a conductor layer already formed on it. A variety of properties are required for these resins as insulating adhesive, particularly the high adhering strength at a normal temperature and a high temperature is required from a viewpoint of the electric reliance.

Furthermore, the higher speed of computer signal processing and the higher frequency of communication electric wave for mobile communication are expected to further progress from now on and, accordingly, it is desired that an insulating material for use in printed circuit boards having these utilities has the low dielectric constant and low dielectric loss tangent.

As an adhesive for use in the traditional copper foil with an insulating adhesive, an epoxy resin, a thermoplastic polyimide resin and the like are generally used widely.

A thermoplastic polyimide and epoxy adhesives are excellent in the resistance to heat, the resistance to chemicals, the dimensional stability, the adhering property and the like and are generally used widely as an insulating layer of a copper foil with an insulating adhesive. However, since these compounds have a functional group having the very high polarity such as an imide group, a hydroxy group and the like, a value of dielectric constant and that of dielectric loss tangent have generally become higher.

In order to improve these disadvantages, there is provided an adhesive composition using a silicon systempolymer(JP-A10-140127). However, even in this adhesive composition, there is still a problem that the adhering property at a high temperature is not sufficient. Thus, any insulating adhesive or copper foil with an insulating adhesive satisfying which fully satisfy the demands of the market these requirements can not be found, therefore, there is a great demand for them.

SUMMARY OF THE INVENTION

Accordingly, an object of the present invention is to provide a copper foil with an insulating adhesive in which an insulating adhesive excellent in various properties such as the high adhering property at a normal temperature and a high temperature, low dielectric constant and low dielectric loss tangent and a copper foil are incorporated, and which is easy to be handled, and which can shorten the steps due to a conductor layer already formed on it.

The present inventors studied intensively in order to solve such problems and, as a result, found that the aforementioned problems can be solved by incorporating an insulating adhesive composition having as an essential component an organic compound having at least two alkenyl groups having the reactivity with a SiH group in one molecule and a silicon compound having at least two SiH groups in one molecule with a copper foil, which resulted in the completion of the present invention.

That is, the present invention is a copper foil with an insulating adhesive in which an insulating adhesive comprises as an essential component (A) an organic compound having at least two alkenyl groups having the reactivity with a SiH group in one molecule, (B) a silicon compound having at least two SiH groups in one molecule, and (C) a hydrosilylating catalyst, and a copper foil incorporated therewith.

Further, the component (A) is an organic compound containing alkenyl groups having the reactivity with a SiH group at 0.001 mol or more per 1 g of (A) component.

A copper foil with an insulating adhesive of the present invention is excellent in that it can be used widely for manufacturing a multilayer printed circuit board, an insulating adhesive layer has low dielectric constant, low dielectric loss tangent and high adhering force at a normal temperature and a high temperature, and steps for manufacturing a multilayer printed circuit board can be shortened due to the presence of a copper foil on which a circuit can be formed by etching or the like.

DESCRIPTION OF THE PREFERRED EMBODIMENT

The present invention relates to a copper foil with an insulating-adhesive, more particularly, a copper foil with an insulating adhesive for a multilayer printed circuit board equipped with an insulating adhesive layer having low dielectric constant, low dielectric loss tangent and high adhering force at a normal temperature and a high temperature as well as a copper foil on which a circuit can be formed by etching processing or the like. The present invention is explained below.

The component (A) in the present invention is explained. The component (A) is an organic compound having at least two alkenyl groups having the reactivity with a SiH group one molecule. The elements of the component (A), an organic compound, is not particularly limited as long as it contains only C, H, N, O, S and halogen as a constituent element and an organic polymer skeleton and an organic monomer skeleton may be used in its structure. For example, as an organic polymer skeleton, polyether, polyester, polycarbonate, saturated hydrocarbon, polyacrylic ester, polyamide, and phenol-formaldehyde (phenol resin) skeletons and the like can be used. As a monomer skeleton, for example, there are phenol, bisphenol, aliphatic hydrocarbon, aromatic hydrocarbon and the like, and a mixture thereof. In addition, it may contain a siloxane unit (Si—O—Si) such as a polysiloxane-organic block copolymer and a polysiloxane-organic graft copolymer, but the excess content of siloxane unit may cause a problem of the repellency and less compatibility with the other components.

The alkenyl group for a component (A) may be in anywhere of the molecule, in the main chain or side chain, as long as at least two of it present in a molecule. the alkenyl group in the side chain of the molecule, may covalently bond with the main chain directly, or it may be in the side chain via a di- or more-valent substituent from the main chain of the molecule.

An alkenyl group for a component (A) is not particularly limited as long as it has the reactivity with a SiH group. An alkenyl group represented by the following general formula (1):

(General formula 1)

wherein $R^1$ represents a hydrogen atom or a methyl group, is suitable from a viewpoint of the reactivity. In addition, from the view of easy availability of a raw material,

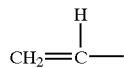

is particularly preferable.

An alkenyl group may be covalently bound to the main chain of a component (A) via a di- or more-valent substituent and a di- or more-valent substituent is not particularly limited as long as it is a substituent having a carbon number of 0 to 10 and containing only C, H, N, O, S and halogen as a constituent element.

An example thereof is

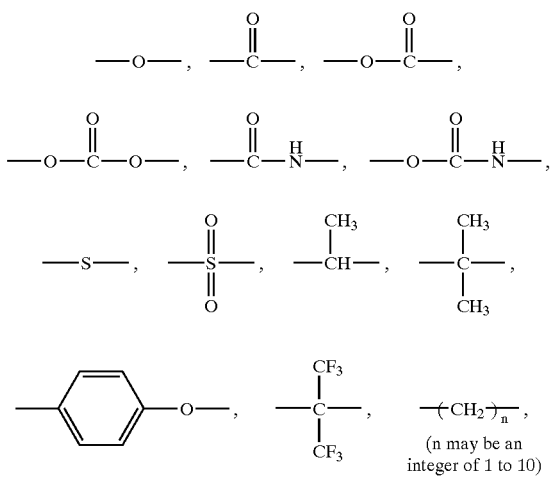

(n may be an integer of 1 to 10)

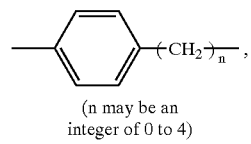

(n may be an integer of 0 to 4)

In addition, two or more of these di- or more-valent substituent groups may be linked by a covalent bond to be constitute one di- or more-valent substituent.

As an example of the substituent group which is covalently bound to the above main chain of a molecule of component (A), there are vinyl group, allyl group, methallyl group, acryl group, methacryl group, 2-hydroxy-3-(allyloxy)propyl group, 2-allylphenyl group, 3-allylphenyl group, 4-allylphenyl group, 2-(allyloxy)phenyl group, 3-(allyloxy)phenyl group, 4-(allyloxy)phenyl group, 2-(allyloxy)ethyl group, 2,2-bis(allyloxymethyl)butyl group, 3-allyloxy-2,2-bis(allyloxymethyl)propyl group:

$$CH_2=CH-CH_2(-O-CH_2-CH_2)-_n$$

(n may be a number of 2 to 5 . . . )

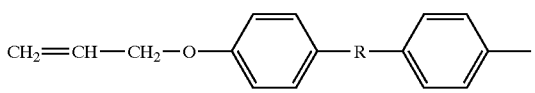

wherein R is selected from

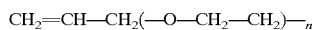

Among the aforementioned components (A), from a viewpoint of the ability to further improve the resistance to heat, a component (A) is preferable which contains an alkenyl group having the reactivity with a SiH group at 0.001 mol or more per 1 g component of (A), preferably 0.005 mol or more per 1 g, particularly preferably 0.008 mol or more. As an embodiment of components (A), there are butadiene, isoprene cyclopentadiene, dicyclopentadiene, cyclohexadiene, decadiene, norbornadiene, diallyl phthalate, trimethylolpropane diallyl ether, pentaerythritol triallyl ether, divinylbenzenes, 1,3-diisopropenylbenzene, 1,4-diisoproneylbenzene, divinylnaphthalene, divinylbiphenyl and its oligomer, 1,2-polybutadiene:

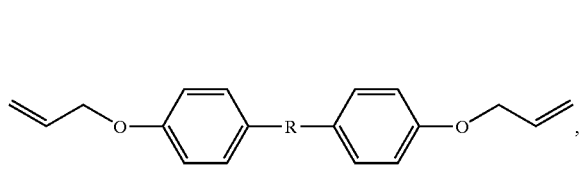

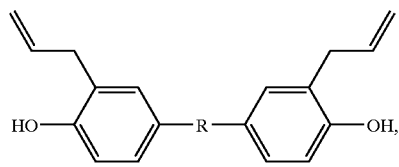

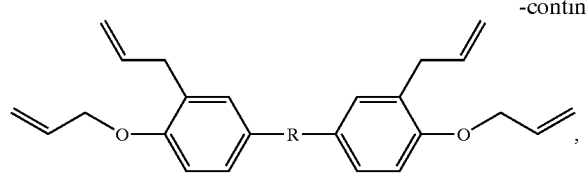
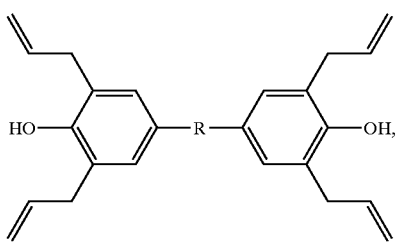

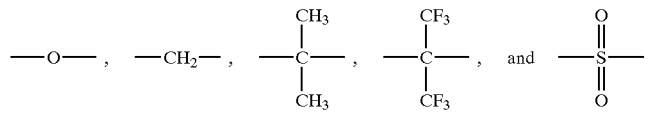

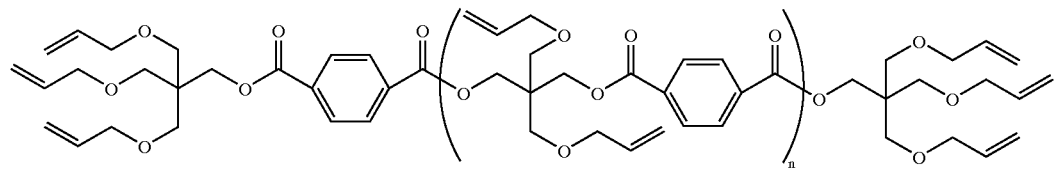

The present invention is not limited to them.

In addition, from a viewpoint of the ability to further improve the hear resistance, and from a viewpoint of industrial availability, as the above component (A), an organic compound having at least two alkenyl groups having the reactivity with a SiH group in one molecule represented by the following general formula (2):

(General formula 2)

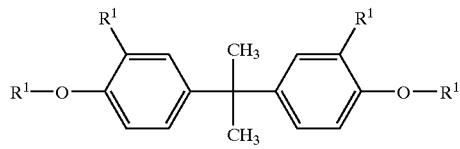

wherein $R^1$ represents a group having a carbon number of 2 to 6 and containing an alkenyl group having the reactivity with a SiH group, or a hydrogen atom, is preferable. As an embodiment thereof, there is

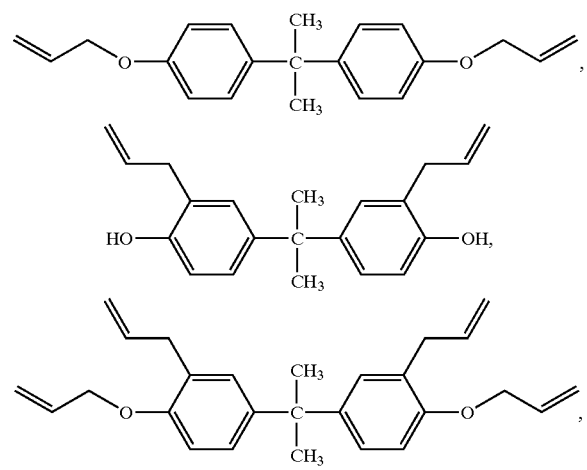

-continued

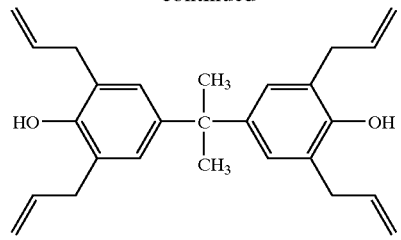

but the present invention is not limited to it.

A number of alkenyl groups having the reactivity with a SiH group in a component (A) is sufficiently at least two per one molecule on average. From a viewpoint of the ability to further improve the resistance to heat, the number preferably exceeds 2, more preferably 3 or more, particularly preferably 4 or more. When the number of alkenyl groups having the reactivity with a SiH group in a component (A) is 1 or less per one molecule, even reacted with a component (B), only a graft structure is obtained and not a crosslinked structure.

A component (A) having the flowability at a temperature of 100° C. or lower is preferable in order to obtain the better mixing with other components and the better workability. The component (A) may be linear or branched structure, and a molecular weight is not particularly limited but a weight-average molecular weight of 100 to 100,000 can be suitably used. When a weight-average molecular weight is 100,000 or more, the workability is worse due to high viscosity of a raw material and it is difficult to manifest the effects of crosslinking by a reaction of an alkenyl group and a SiH group.

Next, a compound having a SiH group, a component (B), is explained.

A compound having a SiH group which can be used in the present invention is not particularly limited and, for example, a compound having at least two SiH groups per one molecule among compounds described in International Publication WO96/15194 can be used.

Among them, from a viewpoint of availability, a linear and/or cyclic polyorganosiloxane having at least two SiH groups in one molecule is preferable. From a viewpoint of the better compatibility with a component (A), further, a cyclic polyorganosiloxane having at least two SiH groups in one molecule represented by the following general formula (3):

(General formula 3)

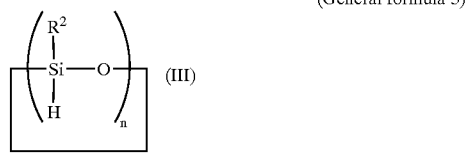

wherein $R^2$ represents an organic group of a carbon number of 1 to 6, and n represents a number of 3 to 10, is preferable.

Furthermore, from a viewpoint of the better compatibility with the above component (A), a component (B) is also preferable to be a compound which has in its molecule a skeleton introduced by one or more kinds of compounds (herein after referred to as (E)) selected from organic compounds having an alkenyl group and has at least two SiH groups in one molecule.

Specifically, one example is a linear and/or cyclic polyorganosiloxane.

As a component forming the skeleton of component (B), a component (E), the same organic polymer skeleton and organic monomer skeleton explained for the above component (A) can be used. From the ability to heighten the compatibility of a component (B) with a component (A), as a preferable embodiment of a component (E), there are allyl ether of novolac phenol and bisphenol A diallyl ether, 2,2'-diallylbisphenol A, diallyl phthalate, bis(2-allyloxyethyl) phthalate, styrene, α-methylstyrene, vinylbiphenyl, vinylnaphthalene, vinyl benzoate, 1,1-diphenylethylene, allyl-terminated poly(propylene oxide) and poly(ethylene oxide). The present invention is not limited to them. An organic compound of a component (E) may be used alone or in combination of two or more of them.

Various components (B) as described above may be used alone or in combination of two or more of them to be an adhesive for copper foil with insulating adhesive of present invention.

A mixing ratio of the aforementioned component (A) and component (B) is not limited as long as the performance as an insulating adhesive is not lost, but it is generally preferable that a ratio of a number (X) of alkenyl groups having the reactivity with a SiH group in the above component (A) and a number (Y) of SiH groups in the above component (B) is $2 \geq Y/X \geq 0.5$. Further, from a viewpoint of the better adherability with a copper foil, $2 \geq Y/X \geq 1.2$ is preferable.

When $X/Y>2$ or $0.5>Y/X$, the sufficient curing property can not be obtained and the resistance to heat may be deteriorated.

Next, a hydrosilylating catalyst, a component (C), is explained. A hydrosilylating catalyst is not particularly limited as long as it has the catalytic activity for a hydrosilylating reaction. For example, there are a catalyst in which solid platinum is carried on a carrier such as platinum as a simple substance, alumina, silica, and carbon black, chloropratinic acid, a complex of chloroplatinic acid with alcohol, aldehyde, ketone or the like, platinum-olefin complex (for example, $Pt(CH_2=CH_2)_2(PPh_3)_2$, $Pt(CH_2=CH_2)_2Cl_2$), platinum-vinylsiloxane complex [Pt(ViMe$_2$SiOSiMe$_2$Vi)$_n$, Pt[(MeViSiO)$_4$]$_m$), platinum-phosphine complex (for example, $Pt(PPh_3)_4$, $Pt(PBu_3)_4$), platinum-phosphite complex (for example, $Pt[P(OPh)_3]_4$, $Pt[P(OBu)_3]_4$) (wherein Me represents methyl group, Bu represents butyl group, Vi represents vinyl group, Ph represents phenyl group, and n and m represent an integer); and dicarbonyldichloroplatinum, as well as Karstedt catalyst, a platinum-hydrocarbon catalyst described in the specifications of U.S. Pat. No. 3,159,601 and U.S. Pat. No. 3,159,662 to Ashby, and a platinum alcoholate catalyst described in the specification of U.S. Pat. No. 3,220,972 to Lamoreaux. Further, a platinum chloride-olefin complex described in the specification of U.S. Pat. No. 3,516,946 to Modic is also useful in the present invention.

In addition, as an example of a catalyst other than above-described platinum compounds, there are $RhCl(PPh_3)_3$, RhCl3, RhAl$_2$O$_3$, RuCl$_3$, IrCl$_3$, FeCl$_3$, AlCl$_3$, $PdCl_2.2H_2O$, NiCl$_2$, TiCl$_4$ and the like.

Among them, from a viewpoint of the catalytic activity, a chloropratinic acid, a platinum-olefin complex, a platinum-vinylsiloxane complex and the like are preferable. In addition, these catalysts may be used alone or in combination of two or more of them.

An amount of a catalyst to be added is not particularly limited but the amount is preferably in a range of $10^{-1}$ to $10^{-8}$ mol per 1 mol of SiH group, more preferably in a range of $10^{-2}$ to $10^{-6}$ mol in order to allow for the sufficient curing property and suppress the cost of a insulating adhesive composition to relatively low level.

In addition, a promoter can be used with the above catalyst. As an example thereof, there are a phosphorus compound such as triphenylphosphine, a 1,2-diester compound such as dimethyl maleate, an acetylene alcohol compound such as 2-hydroxy-2-methyl-1-butyne, a sulfur compound such as sulfur as a simple substance, and an amine compound such as triethylamine. An amount of a promoter to be added is not particularly limited but the amount is preferably in a range of $10^{-2}$ to $10^2$ mol, more preferably in a range of $10^{-1}$ to 10 mol per 1 mol of catalyst.

Further, in order to improve the storage stability of an insulating adhesive composition of the present invention and to adjust the reactivity of a hydrosilylating reaction in a process for manufacturing an adhesive, a curing retarding agent may be used. As a curing retarding agent, there are a compound containing an aliphatic unsaturated bond, an organophosphorus compound, an organosulfur compound, a nitrogen-containing compound, a tin-containing compound, an organoperoxide and the like. These may be used together. As a compound containing an aliphatic unsaturated bond, there can be exemplified propargyl alcohols, ene-yne compounds, maleic esters and the like. As an organophosphorus compound, there can be exemplified triorganophosphines, diorganophosphines, organophosphones, triorganophosphites and the like. As an organosulfur compound, there can be exemplified organomercaptans, diorganosulfides, hydrogen sulfide, benzothiazole, benzothiazole disulfide and the like. As a nitrogen-containing compound, there can be exemplified ammonia, primary to tertiary alkylamines, arylamines, urea, hydrazine and the like. As a tin-containing compound, there can be exemplified stannous halide dihydrate, stannous carboxylate and the like. As an organoperoxide, there can be exemplified di-t-butyl peroxide, dicumyl peroxide, benzoyl peroxide, t-butyl perbenzoate and the like.

Among these curing retarding agents, from a viewpoint of the better retarding property and better availability of a raw material, benzothiazole, thiazole, dimethyl maleate, and 3-hydroxy-3-methyl-1-butyne are preferable.

An amount of a storage stability improving agent to be added is preferably in a range of $10^{-1}$ to $10^3$ mol, more preferably 1 to 50 mol per 1 mol of a hydrosilylating catalyst.

Although various combinations can be used as an adhesive composition of the present invention as described above, from a viewpoint of the better resistance to heat, such an adhesive composition is preferable that a cured material obtained by curing an adhesive composition has Tg of 50° C. or higher, more preferably 100° C. or higher, particularly preferably 200° C. or higher.

Since when an inorganic filler is added to an insulating adhesive composition of the present invention, the addition has the effect of alleviating the heat shock such as soldering, prevention of the flowability of an adhesive, and stabilization and improvement of the adhering strength, it can be preferably used. As an inorganic filler, inorganic fillers which are excellent in the electric insulating property and are particulate are preferable and examples thereof are alumina, aluminium hydroxide, fused silica, crystalline silica, superfine amorphous silica and hydrophobic superfine silica, talc, barium sulfate and the like.

An aging preventing agent, a radical prohibiting agent, an ultra-violet absorbing agent, an adhering property improving agent, a flame-retardant, a surfactant, a storage stability improving agent, an antiozonant, a light-stabilizer, a thickener, a plasticizer, a coupling agent, an antioxidant, a thermal stabilizer, a conductivity imparting agent, an antistatic agent, a radiation blocker, a nucleating agent, a phosphorus peroxide decomposing agent, a lubricant, a pigment, a metal deactivator, a property adjusting agent can be added to an insulating adhesive of the present invention in such a range that dose not deteriorate the object and the effects of the present invention.

Further, a variety of resins may be added in order to improve the property of an insulating adhesive of the present invention. Examples of a resin include but not limited to epoxy resin, cyanate resin, phenol resin, acrylic resin, polyimide resin, polyvinylacetal resin, urethane resin and polyester resin.

Next, a method of incorporating an insulating adhesive composition and a copper foil is explained. Above-described component(A), (B), (C), and other additives added as needs dictate are mixed to be an insulating adhesive composition for a copper foil with insulating adhesive of the present invention.

The insulating adhesive composition is laminated on a copper foil by coating method or the like. Upon coating, although an insulating adhesive composition of the present invention can be coated as it is, the adhesive composition may be dissolved in an organic solvent,which can be coated on a copper foil. A solvent which can be used is not particularly limited and, by way of an example, a hydrocarbon solvent such as benzene, toluene, hexane and heptane, an ether solvent such as tetrahydrofuran, 1,4-dioxane and diethyl ether, a ketone solvent such as acetone and methyl ethyl ketone, and a halogenated solvent such as chloroform, methylene chloride and 1,2-dichloroethane can be suitably used. Solvents may be used as a mixed solvent of two or more solvents. As a solvent, toluene, tetrahydrofuran and chloroform are preferable. An amount of a solvent to be used is preferably in a range of 0 to 10 ml, more preferably 0.5 to 5 ml, particularly-preferably 1 to 3 ml per 1 g of reactive component (A). When an amount to be used is small, it is difficult to obtain an effect by using a solvent with lower viscosity, while an amount is large, there arises a problem of thermal crack due to the remaining solvent in an adhesive and it becomes disadvantageous in terms of cost, leading to the lowered industrial use value. A thickner or the like can be added in preparation of an adhesive body to improve the moldability of the film, granted that it may become difficult to control the thickness of formed adhesive layer because the viscosity of an insulating adhesive composition of the present invention can become relatively lower.

There is a further practical method comprising pre-mixing an insulating adhesive composition of the present invention and heating the composition thereafter, in which the pre-mixing has alkenyl groups having the reactivity with a SiH group and SiH groups to be partially reacted in the composition so that the viscosity of the composition is suitably adjusted. According to the present method, the composition can be adjusted to the arbitrary viscosity by controlling the reaction conditions. Furthermore the addition of additives becomes unnecessary to be industrially advantageous.

An insulating adhesive composition having the flowability which has been prepared in advance is incorporated with a copper foil to form a copper foil with insulating adhesive of the present invention. For example, there is a common method to incorporate a insulating adhesive with a copper foil which comprises an coating a mixture of above-described components on a copper foil with a roller, a reverse roller, a bar coater or the like, and drying or pre-drying.

A kind of a copper foil used upon this is not particularly limited but an electrolytic copper foil and a rolled copper foil which are generally on the market can be used. A thickness of a copper foil is not particularly limited but is preferably 1 to 50 $\mu$m. There is no particular limit regarding a coating surface but it is preferable to coat on a mat surface of a copper foil from a viewpoint of high adhering property. After coating, the coating is made to be tack-free by heating at a suitable temperature. A temperature upon this is preferably set at a temperature at which hydrosilylation does not occur completely. More particularly, 150° C. or lower is preferable. It is preferable that coating is performed such that the thickness of a coated adhesive is 5 to 100 $\mu$m. When the thickness is below 5 $\mu$m, the insulating property between layers is insufficient in some cases, while when the thickness is larger than 100 $\mu$m, it becomes difficult to prepare to the constant thickness, being not preferable.

A method of incorporation by a coating method is not defined to the described above method and it may be possible by other methods. For example, incorporation may be possible by a method of laminating a film-like adhesive layer formed in advance with a copper foil.

The copper foil with insulating adhesive of the present invention is used in printed circuit board, particularly in multilayer printed circuit board. Next, a method for manufacturing a multilayer printed circuit board using a copper foil with an insulating adhesive of the present invention is explained. A copper foil with an insulating adhesive of the present invention is laminated on an inner layer circuit substrate having an arbitrary thickness using a heat-pressure roller or a heat-pressure press at a temperature/pressure of 50 to 200° C., 1 to 20 kgf/cm². Subsequently, heating is performed at 100 to 300° C. for 1 to 24 hours to promote the curing of an adhesive layer. After metallization patterning, the next copper foil with an insulating adhesive is laminated on it with heat-pressurizing in a similar way, and then a multilayer printed circuit board is finally obtained. Alternately, a multilayer printed circuit board is obtained by laminating some copper foils with an insulating adhesive which has already been applied metallization patterning and heat-pressurizing thereafter. The produced multilayer printed circuit board is equipped with an insulating adhesive layer having low dielectric constant, low dielectric loss tangent and high adhering force at a normal temperature and a high temperature, and steps for manufacturing a multilayer printed circuit board can be shortened due to the presence of a copper foil on which a circuit can be formed by etching processing or the like.

EXAMPLES

The present invention is explained by way of Examples and Comparative Examples but is not limited thereto.

Synthesis Example 1

A 1 L three-neck flask was equipped with a stirrer, a three-way cock, and a condenser. 114 g of bisphenol A, 145 g of potassium carbonate, 140 g of allyl bromide and 250 ml of acetone were placed in this flask, and the mixture was stirred at 60° C. for 12 hours. The supernatant was taken, washed with an aqueous solution of sodium hydroxide using a separating funnel and, thereafter, washed with water. The oily layer was dried with sodium sulfate and, thereafter, the solvent was distilled off by an evaporator, and then 126 g of pale yellow liquid was obtained. Disappearance of a hydroxy group peak of bisphenol A and formation of an allyl group were confirmed by $^1$H-NMR (manufactured by Varian, Gemini-300 300 MHz) and it was found to be aryletherized compound, allylated bisphenol. The yield was 82% and the purity obtained by reversed phase liquid chromatography was 95% or more. The measuring conditions for reversed phase liquid chromatography and a measuring apparatus are as follows:
[Moving bed]
Water/acetonitrile gradient 60:40-0:100 (20 minutes)
[Column]
Cica-Merck Prosphere RP18 (length 300 mm, inner diameter 4 mm) (Kanto Chemical Co., Ltd.)
[Detector]
MCPD3600 Photodiode array detector (Otsuka Electnics Co.,Ltd.)
[Pump]
CCPM High pressure gradient pump (Toso Co. Ltd.)

Example 1

1.0 g of allylated bisphenol prepared in Synthesis Example 1, 0.58 g of 1,3,5,7-tetramethylcyclotetrasiloxane (manufactured by Shin-etsu Chemical Co., Ltd., KF-9902) and 1 mL of methyl ethyl ketone as a solvent were placed and mixed. After 4.7 mg of dimethyl maleate was added to the mixture and then mixed, 4.7 mg of a platinum vinylsiloxane catalyst (manufactured by Degussa-Hules Corporation, PTVTS-3.0X) was added to mixture, an insulating adhesive composition was obtained. The adhesive composition was coated on a rolled copper foil (manufactured by Japan Energy Corporation, BHY-22B-T, thickness 18 μm) with a bar coater, it was heated in a hot air dryer set at 100° C. for 2 minutes to obtain a copper foil with an insulating adhesive having the thickness of an insulating adhesive layer of 50 μm. This was further heated at 200° C. for 3 hours to cure completely and, thereafter, the whole surface of a copper foil was etched, dieletric constant and dielectric loss tangent at 12.5 GHz were measured with a molecular orientation measuring apparatus (MOA-2012A) manufactured by Oji Scientific Instruments to obtain the results of dielectric constant of 2.6 and dielectric loss tangent of 0.011. Subsequently, the copper foil with an insulating adhesive manufactured described above was laminated on a epoxy double-sided copper-clad laminate which substrate is a glass cloth-reinforced epoxy resin (thickness 0.1 mm, thickness of a copper foil 35 μm) in which an inner circuit had been formed by etching in advance with a heat-pressure roller set at a temperature of 120° C., a linear pressure of 5 kgf/cm, and a rate of 0.5 m/min. Subsequently, heating was performed at 200° C. for 3 hours to complete a curing reaction, to obtain a multilayer printed circuit board. Regarding the multilayer board thus obtained, the adhering strength (an average value of a load tested at width of 3 mm, peeling angle of 90 degree, and peeling rate of 50 mm/min.) was measured at a normal temperature and 100° C., to obtain the results of 8 N/cm at a normal temperature and 5 N/cm at 100° C.

Example 2

1.00 g of allylated bisphenol prepared in Synthesis Example 1, 0.20 g of 1,3,5,7-tetramethylcyclotetrasiloxane (manufactured by Shin-etsu Chemical Co., Ltd., KF-9902) and 1 mL of methyl ethyl ketone as a solvent were placed in a 10 ml flask equipped with a stirrer to mix them. 4.7 mg of a platinum vinylsiloxane catalyst (manufactured by Degussa Japan, PTVTS-3.0X) was added under stirring. The mixture reacted under exotherm. After reacted for about 1 hour, 4.7 mg of dimethyl maleate was added. 0.38 g of 1,3,5,7-tetramethylcyclotetrasiloxane was further added to the resulting mixture to mix, an adhesive composition with the viscosity adjusted was obtained. Thereafter, a copper foil with an insulating adhesive was manufactured according to the same procedures as those of Example 1 to obtain measured values of dieletric constant of 2.6 and dielectric loss tangent of 0.010. Thereafter, a multilayer printed circuit board was manufactured according to the same procedures of Example 1, to obtain the results of the adhering strength of 8 N/cm at a normal temperature and 5 N/cm at 100° C.

Example 3

1.00 g of polybutadiene (manufactured by Nippon Soda Co., Ltd., NISSO-PB-B1000) and 1.41 g of 1,3,5,7-tetramethylcyclotetrasiloxane (manufactured by Shin-etsu Chemical Co., Ltd., KF-9902) were mixed. 94 mg of a platinum vinylsiloxane catalyst (manufactured by Degussa Japan, PTVTS-3.0X) was added to obtain an adhesive composition. Thereafter, a copper foil with an insulating adhesive was manufactured according to the same procedures as those of Example 1, to obtain measured values of dieletric constant of 2.2 and dielectric loss tangent of 0.003. Thereafter, a mutilayer printed board was manufactured according to the same procedures as those of Example 1, to obtain the measured results of adhering strength of 8 N/cm at a normal temperature and 4 N/cm at 100° C.

Comparative Example 1

2.00 g of bisphenol A glycidyl ether epoxy resin (manufactured by YUKA SHELL EPOXY K. K., Epikote 828) and 1.67 g (solids concentration 60%) of a solution of a phenol novolac resin (Gun-ei Chemical Industry Co., Ltd. Resist Top, PSM4261) in methyl ethyl ketone were mixed to obtain an adhesive composition. Thereafter, a copper foil with an insulating adhesive was manufactured according to the same procedures as those of Example 1, to obtain measured values of dieletric constant of 3.1 and dieletric loss tangent of 0.035. Thereafter, a mutilayer printed circuit board was manufactured according to the same procedures as those of Example 1, obtained the measured results of adhering strength of 10 N/cm at a normal temperature and 5 N/cm at 100° C. Provided that the conditions for heating upon manufacturing of a sample for dieletric property evaluation and a multilayer printed circuit board were changed to 120° C./1 hour, 140° C./1 hour, and 160° C./2 hours. Comparative Example 1 is superior in adhering strength but is much inferior in both dieletric constant and dieletric loss tangent as compared with the present invention.

What is claimed is:

1. A copper foil with an insulating adhesive incorporated therewith for use in a multilayer printed circuit, an inner layer circuit substrate on which said copper foil with said insulating adhesive are laminated, said copper foil with insulating adhesive incorporated therewith prepared by incorporating the insulating adhesive with the copper foil at a temperature of 150° C. or less, wherein said insulating adhesive comprises as essential components:

(a) an organic compound having at least two alkenyl groups in one molecule that have reactivity with a SiH group, which is selected from the group consisting of cyclohexadiene, diallyl phthalate, trimethylolpropane diallyl ether, pentaerythritol triallyl ether, divinylnaphthalene, divinylbiphenyl and their oligomers, 1,2-polybutadiene,

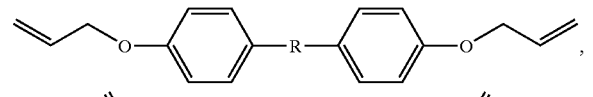

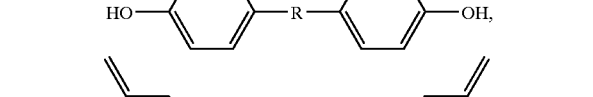

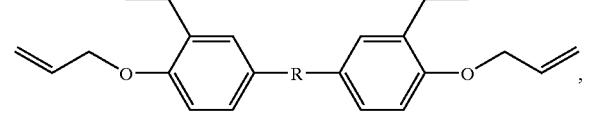

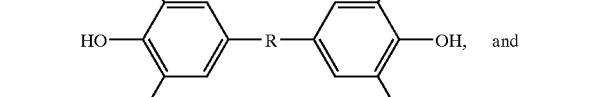

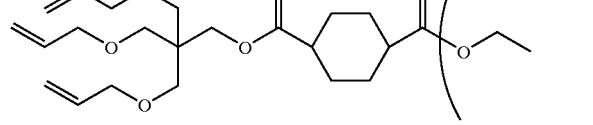

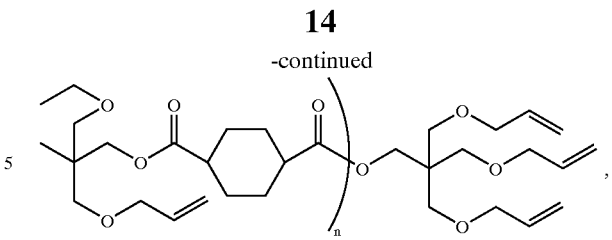

wherein R represents a divalent residue selected from the group consisting of

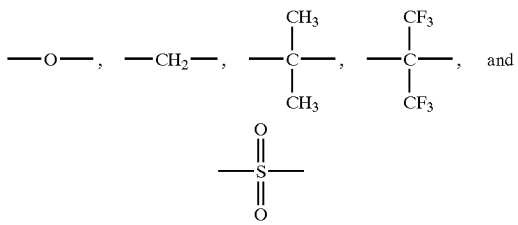

and n is≈1;

(b) a silicon compound having at least two SiH groups in one molecule, and (c) a hydrosilylating catalyst.

2. The copper foil with an insulating adhesive according to claim 1, wherein the component (a) is an organic compound containing alkenyl groups having the reactivity with a SiH group at 0.001 mol or more per 1 g (a) component.

3. The copper foil with an insulating adhesive according to claim 1, wherein the organic compound (a) having at least two alkenyl groups in one molecule that have reactivity with a SiH group is selected from the group consisting of cyclohexadiene, diallyl phthalate, trimethylolpropane diallyl ether, pentaerythritol triallyl ether, divinylnaphthalene, divinylbiphenyl and their oligomers,

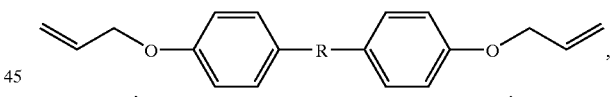

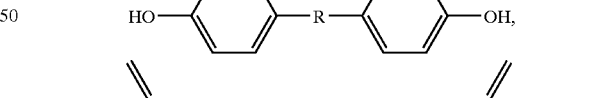

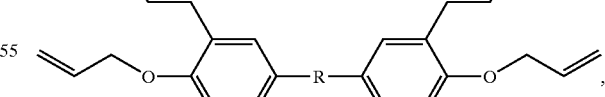

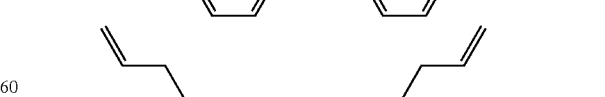

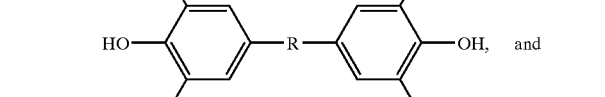

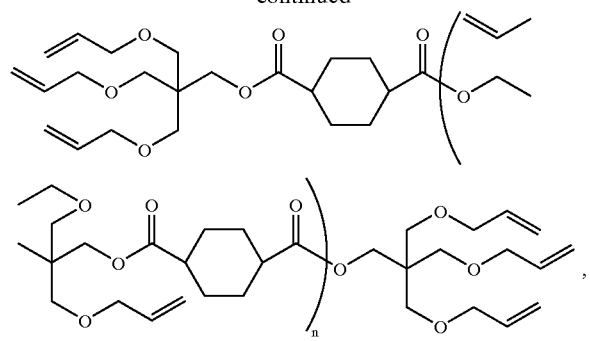

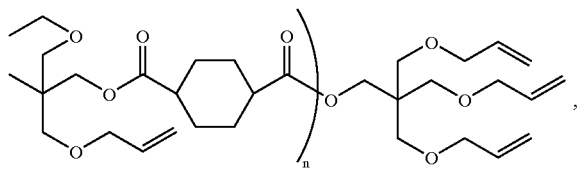

wherein R represents a divalent residue selected from the group consisting of

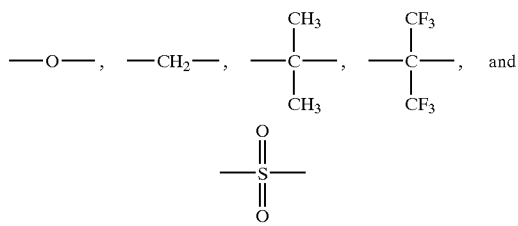

and n is≈1.

4. The copper foil with an insulating adhesive according to claim 1, wherein the organic compound (a) having at least two alkenyl groups in one molecule that have reactivity with a SiH group is selected from the group consisting of divinylnaphthalene, divinylbiphenyl and their oligomers,

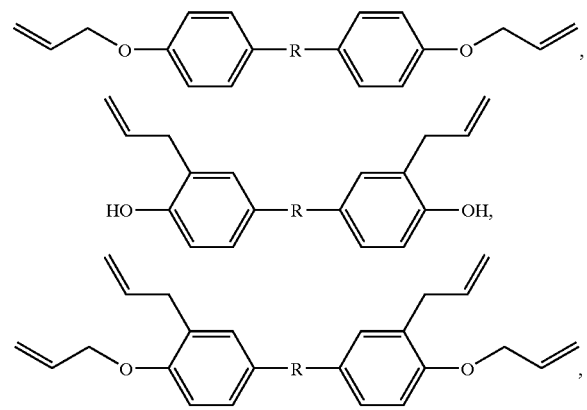

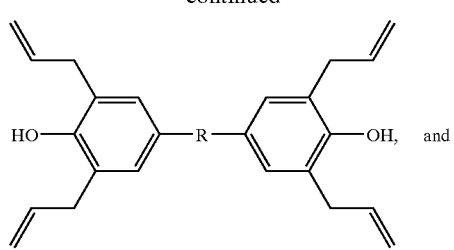

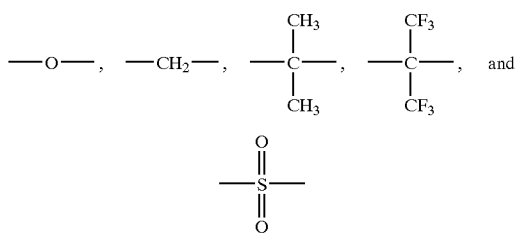

wherein R represents a divalent residue selected from the group consisting of

and n is≈1.

5. The copper foil with an insulating adhesive according to claim 3, wherein R in the organic compound (a) is —C(CF$_3$)$_2$—.

* * * * *